United States Patent
Vora et al.

(10) Patent No.: US 8,976,897 B2
(45) Date of Patent: Mar. 10, 2015

(54) SUPPRESSION OF SPURIOUS HARMONICS GENERATED IN TX DRIVER AMPLIFIERS

(71) Applicant: QUALCOMM Incorporated, San Diego, CA (US)

(72) Inventors: Sameer Vasantlal Vora, San Diego, CA (US); Wing Fat Andy Lau, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/949,736

(22) Filed: Jul. 24, 2013

(65) Prior Publication Data

US 2015/0030105 A1   Jan. 29, 2015

(51) Int. Cl.
  *H04K 1/02*   (2006.01)
  *H04L 25/03*  (2006.01)
  *H04L 25/49*  (2006.01)
  *H04B 1/04*   (2006.01)

(52) U.S. Cl.
  CPC ...... *H04B 1/0475* (2013.01); *H04B 2001/0416* (2013.01)
  USPC ...... 375/297; 375/259; 455/114.3; 455/127.2

(58) Field of Classification Search
  USPC ......... 375/259, 284, 295–298; 455/91, 114.2, 455/114.3, 127.2, 127.3
  See application file for complete search history.

(56) References Cited

U.S. PATENT DOCUMENTS

| | | | |
|---|---|---|---|
| 6,799,020 B1 * | 9/2004 | Heidmann et al. | 455/103 |
| 7,130,604 B1 | 10/2006 | Wong et al. | |
| 7,519,348 B2 | 4/2009 | Shah | |
| 2004/0252786 A1 * | 12/2004 | McHenry | 375/297 |
| 2006/0160518 A1 | 7/2006 | Seendripu et al. | |
| 2006/0205370 A1 | 9/2006 | Hayashi et al. | |
| 2007/0230615 A1 * | 10/2007 | Taylor et al. | 375/297 |

(Continued)

FOREIGN PATENT DOCUMENTS

| | | |
|---|---|---|
| WO | WO-2006/063358 A1 | 6/2006 |
| WO | WO-2010/089700 A1 | 8/2010 |

OTHER PUBLICATIONS

International Search Report and Written Opinion—PCT/US2014/047160—ISA/EPO—Oct. 15, 2014. (12 total pages).

(Continued)

*Primary Examiner* — Jean B Corrielus
(74) *Attorney, Agent, or Firm* — Arent Fox LLP

(57) ABSTRACT

The transmission path of a communication device includes, in part, N upconverters each of which receives M phases of a signal to be transmitted. Each upconverter further receives one of N sets of phases of a LO signal. Each of the N sets includes M phases of the LO signal. The communication device further includes at least one combiner, and N amplifiers each responsive to a different one of the N upconverters to generate N amplified signals. The combiner combines the N amplified signals to generate an output signal. By selecting the gain of one of the amplifiers to be different than the gain of the remaining amplifiers, the undesired harmonics of the signal to be transmitted, caused by non-linearity of the amplifiers, is reduced. Each upconverter optionally includes a multitude of upconverters whose outputs are combined to further reduce the spurious harmonic upconversion products and the counter-intermodulation distortion (IM3).

60 Claims, 11 Drawing Sheets

(56) References Cited

U.S. PATENT DOCUMENTS

| | | |
|---|---|---|
| 2009/0143031 A1 | 6/2009 | Shah |
| 2009/0184763 A1* | 7/2009 | Kim .......................... 330/124 R |
| 2009/0325510 A1 | 12/2009 | Pullela et al. |
| 2010/0110307 A1 | 5/2010 | Leme et al. |
| 2010/0158083 A1* | 6/2010 | Morris et al. ................. 375/219 |
| 2011/0007838 A1* | 1/2011 | Vromans ..................... 375/296 |
| 2013/0130632 A1 | 5/2013 | Oishi |

OTHER PUBLICATIONS

Molnar A., et al., "Impedance, filtering and noise in n-phase passive CMOS mixers", Custom Integrated Circuits Conference (CICC), 2012 IEEE, IEEE, Sep. 9, 2012, pp. 1-8, XP032251851, DOI: 10.1109/CICC.2012.6330616, ISBN: 978-14673-1555-5.

* cited by examiner

FIG. 4A

SUPPRESSION OF SPURIOUS HARMONICS GENERATED IN TX DRIVER AMPLIFIERS

BACKGROUND

The present disclosure relates to electronic circuits, and more particularly to a transmitter used in such circuits.

A wireless communication device, such as a cellular phone, includes a transmitter for transmitting signals and a receiver for receiving signals. The receiver often downconverts an analog radio frequency (RF) signal to an intermediate frequency (IF) signal which is filtered, amplified, and converted to a baseband signal. The transmitter converts a baseband digital signal to an analog signal, which is filtered and upconverted to an RF signal before being transmitted.

Non-linearity in the circuit blocks coupled to the output of the upconversion mixers, such as power amplifiers (PA) and driver amplifiers, often generate harmonics of the transmitted signal. Such harmonics, particularly the third and fifth harmonics, are undesired and should be kept below a certain threshold in order to meet the emission requirements. In the long term evolution (LTE) standard, such harmonics may couple to and desensitize an aggregated receiver associated with a different band when carrier aggregation is employed. Controlling the transmitter harmonics remains a challenge.

BRIEF SUMMARY

A communication device, in accordance with one embodiment of the present invention includes, in part, N upconverters, N amplifiers and at least one combiner. Each upconverter, made up of either M single balanced upconversion mixers or M/2 double-balanced upconversion mixers, receives M phases of a baseband signal to be transmitted. Each upconverter further receives a different one of N sets of phases of a local oscillator (LO) signal. Each of the N sets includes M different phases of the LO signal. Each amplifier is responsive to a different one of the upconverters to generate an amplified upconverted signal. The combiner combines the N amplified upconverted signals to generate an output signal. Undesired upconverted signal component at a frequency equal to a multiple of a sum of the LO signal frequency and the baseband signal frequency, or a multiple of a difference between the LO signal frequency and the baseband signal frequency is substantially suppressed from the output signal by selecting a gain of at least one of the amplifiers to be different from the gain of the remaining amplifiers. N and M are integers greater than 1.

In one embodiment, the communication device further includes, in part, a first filter receiving a baseband in-phase signal to generate a first set of filtered in-phase baseband signals to be transmitted, and a second filter receiving a baseband quadrature-phase signal to generate a second set of filtered quadrature-phase of the signals to be transmitted. In one embodiment, the baseband in-phase signal includes a first pair of complementary signals and the baseband quadrature-phase signal includes a second pair of complementary signals. In one embodiment N is 3 and M is 4.

In one embodiment, to eliminate a third harmonic, first and second amplifiers are selected to have an equal gain and a third amplifier is selected to have a gain larger than the gain of the first and second amplifiers. In one embodiment, the gain of the third amplifier is substantially $2^{1/6}$ times the gain of the first and second amplifiers. In one embodiment, the gain of the third amplifier is substantially $2^{1/10}$ times the gain of the first and second amplifiers.

In one embodiment, the four phases of the LO signal in a first set lead corresponding four phases of the LO signal in a second set by 45°. In one embodiment, the four phases of the LO signal in a third set lag corresponding four phases of the LO signal in the second set by 45°. In one embodiment, the four phases of the LO signal in the first are at 315, 135, 45, 225 degrees, the 4 phases of the LO signal in the second set are at 0, 180, 90, 270 degrees, and the 4 phases of the LO signal in the third set are at 45, 225, 135, 315 degrees.

A communication device, in accordance with another embodiment of the present invention includes, in part, N sets of upconverters and N sets of combiners. Each of the N set of upconverters includes Q upconverters. Each of the Q upconverters in each of the N sets receives M phases of a signal to be transmitted. Each of the Q upconverters in each of the N sets further receives one of Q*N sets of phases of a LO signal. Each of the Q*N sets includes M phases of the LO signal. In response, each of the Q upconverters generates an upconverted in-phase signal and an upconverted inverse signal. Each set of combiners is associated with a different one of the N sets of upconverters. A first combiner in each such set combines the N in-phase signals the first combiner receives from its associated upconverters. A second combiner in each set combines the N inverse signals the second combiner receives from its associated upconverters. Undesired upconverted signal component at a frequency equal to a multiple of a sum of the LO signal frequency and the baseband signal frequency, or a multiple of a difference between the LO signal frequency and the baseband signal frequency is substantially suppressed from the combined in-phase and inverse signals, Q, M and N are positive integers.

In one embodiment, the communication device further includes, in part, a first filter receiving a baseband in-phase signal to generate a first set of in-phase signals to be transmitted, and a second filter receiving a baseband quadrature-phase signal to generate a second set of filtered quadrature-phase of the signals to be transmitted. In one embodiment, the baseband in-phase signal includes a first pair of complementary signals and the baseband quadrature-phase signal includes a second pair of complementary signals. In one embodiment, N and Q are equal to three. In one embodiment, N×Q sets of phases of the LO signal includes 5 distinct sets, and M is equal to 4.

In one embodiment, the communication device further includes, in part, N amplifiers each associated with a different one of the N sets of combiners. Each amplifier amplifies the upconverted signal and its inverse it receives from its associated set of combiners. In one embodiment, the gain of at least one of the amplifiers is substantially $2^{1/6}$ times the gain of the remaining amplifiers. In one embodiment, the gain of at least one of the amplifiers is substantially $2^{1/10}$ times the gain of the remaining amplifiers.

In one embodiment, the four phases of the LO signal in a first set lead corresponding four phases of the LO signal in a second set by 45°. In one embodiment, the four phases of the LO signal in a third set lag corresponding four phases of the LO signal in the second set by 45°. In one embodiment, the four phases of the LO signal in the first are at 315, 135, 45, 225 degrees, the 4 phases of the LO signal in the second set are at 0, 180, 90, 270 degrees, and the 4 phases of the LO signal in the third set are at 45, 225, 135, 315 degrees.

A method of communication, in accordance with one embodiment of the present invention includes, in part, applying M phases of a baseband signal to be transmitted to N upconverters, and applying a different one of N sets of phases of a LO signal to each of the N upconverters. Each of the N sets includes a different one of M phases of the LO signal. The method further includes, in part, applying an output signal of each of the N upconverters to a different one of N associated amplifiers to generate N amplified signals, selecting a gain of at least a first one of the N amplifiers to be different from a gain of a remaining one of the N amplifiers, and combining the N amplified signals to generate an output signal. N and M are integers greater than 1.

A method of communication, in accordance with another embodiment of the present invention includes, includes, in part, applying M phases of a baseband signal to be transmitted to N sets of upconverters, each set comprising Q upconverters. The M phases of the baseband signal are applied to each of the Q upconverters of each of the N sets. The method further includes, in part, applying to each of the Q upconverters of each of the N sets one of Q*N sets of phases of a LO signal. Each of the Q*N sets includes M phases of the LO signal. Each of the Q upconverters generates an upconverted signal and its inverse signal. The method further includes, in part, combining the N in-phase signals generated by the Q converters of each of the N sets thereby to generate N combined in-phase signals, and combining the N inverse signals generated by the Q converters of each of the N sets thereby to generate N combined inverse signals. Undesired upconverted signal component at a frequency equal to a multiple of a sum of the LO signal frequency and the baseband signal frequency, or a multiple of a difference between the LO signal frequency and the baseband signal frequency is substantially suppressed from the combined in-phase and inverse signals. Q, M and N are positive integers.

BRIEF DESCRIPTION OF THE DRAWINGS

Aspects of the disclosure are illustrated by way of example. In the accompanying figures, like reference numbers indicate similar elements, and:

FIG. 4A is a block diagram of a number of components disposed in the transmit chain of a transmitter, in accordance with one exemplary embodiment of the present invention.

DETAILED DESCRIPTION OF THE INVENTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure.

Figure 1:
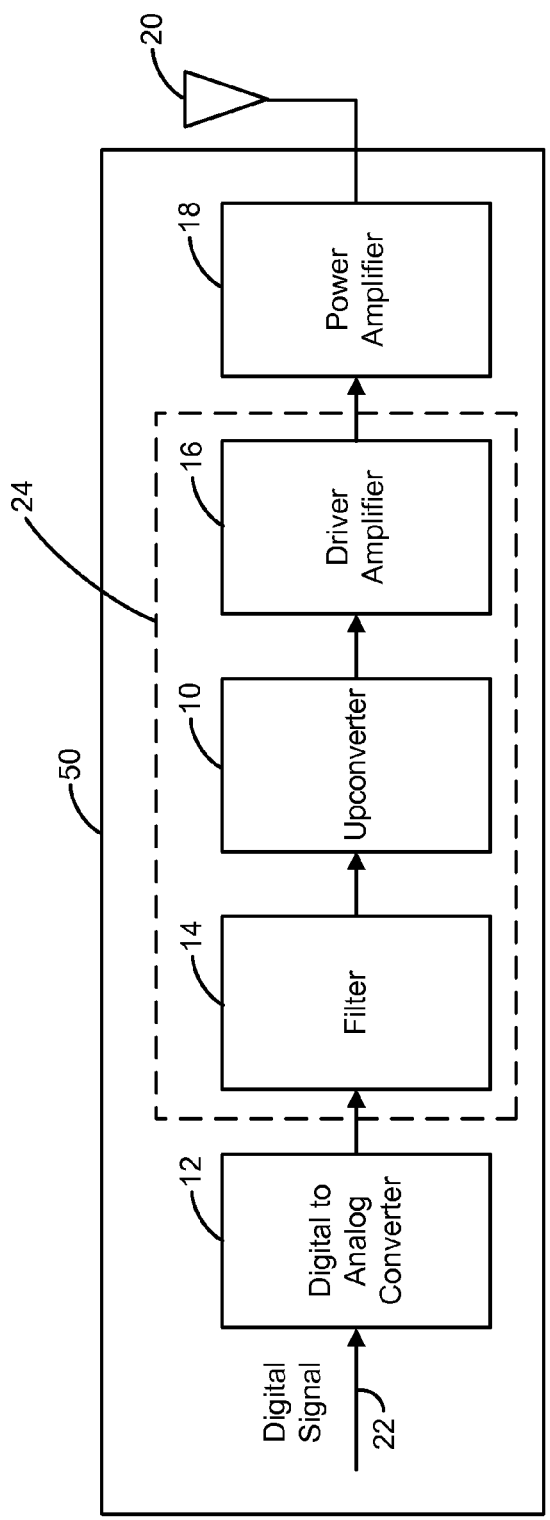
FIG. 1 is a block diagram of a wireless communication device, in accordance with one embodiment of the present invention.

FIG. 1 is a block diagram of a wireless communication device 50 (hereinafter alternatively referred to as device) used in a wireless communication system, in accordance with one embodiment of the present invention. Device 50 may be a cellular phone, a personal digital assistant (PDA), a modem, a handheld device, a laptop computer, and the like.

Device 50 may communicate with one or more base stations on the downlink (DL) and/or uplink (UL) at any given time. The downlink (or forward link) refers to the communication link from a base station to the device. The uplink (or reverse link) refers to the communication link from the device to the base station.

A wireless communication system may be a multiple-access system capable of supporting communication with multiple users by sharing the available system resources (e.g., bandwidth and transmit power). Examples of such systems include code division multiple access (CDMA) systems, time division multiple access (TDMA) systems, frequency division multiple access (FDMA) systems, orthogonal frequency division multiple access (OFDMA) systems, spatial division multiple access (SDMA) systems, and the long term evolution (LTE) systems.

Device 50 is shown as including, in part, frequency upconverter/modulator 10, digital to analog converter (DAC) 12, filter 14 and amplifier 16, which collectively form a transmission channel. Incoming digital signal 22 is first applied to DAC 12. The converted analog signal is filtered by filter 14, frequency upconverted with upconverter/modulator 10 and its output further amplified by amplifier 16. The amplified signal generated by amplifier 16 may be optionally further amplified using a power amplifier 18 before being transmitted by antenna 20. In certain embodiments, the amplified signal at the output of each of the driver amplifier 16 and/or power amplifier 18 may also be filtered (not shown) before passing through other blocks.

Figure 2A:
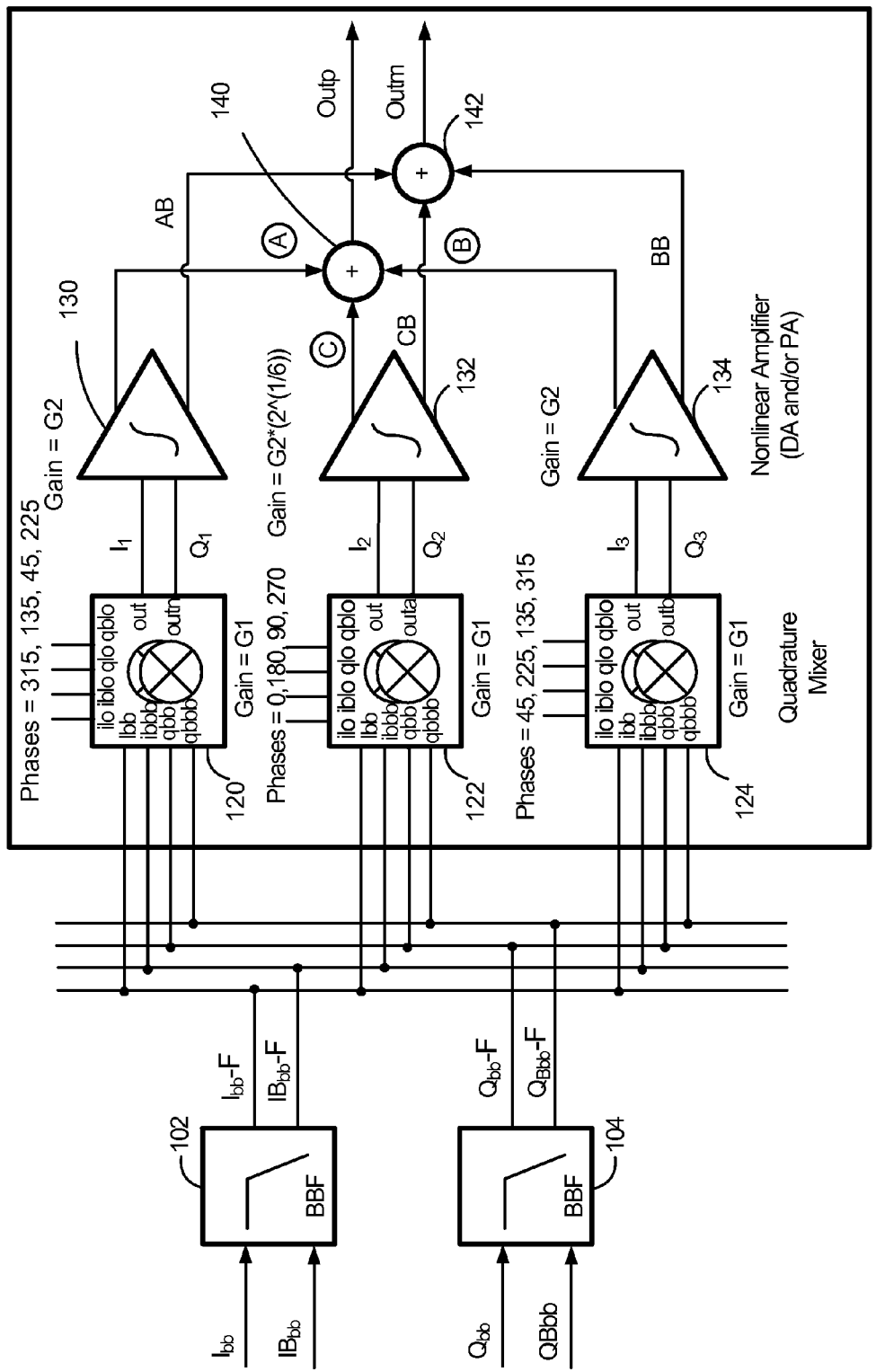
FIG. 2A is a block diagram of a number of components disposed in a transmit chain of a transmitter, in accordance with one exemplary embodiment of the present invention.

FIG. 2A is a block diagram of a number of components disposed in a transmit chain 24, in accordance with one exemplary embodiment of the present invention. Transmit chain 24 is shown as including, in part, filters 102, 104, quadrature upconverters 120, 122, 124, driver amplifiers 130, 132, 134, and combiners 140, 142. Transmit chain 24 is adapted to upconvert the frequency of the signals it receives and suppress spurious harmonics generated in driver amplifiers 130, 132, and 134, as described further below.

Filter 102 filters out undesired signals from the I-channel baseband signals $I_{bb}$ and $IB_{bb}$ to generate filtered baseband signals $I_{bb}\_F$ and $IB_{bb}\_F$. Signals $I_{bb}$ and $IB_{bb}$ are inverse (complement) of one another. Likewise, filter 104 filters out undesired signals from Q-channel baseband signals $Q_{bb}$ and $QB_{bb}$ to generate filtered baseband signals $Q_{bb}\_F$ and $QB_{bb}\_F$. The four filtered baseband signals $I_{bb}\_F$, $IB_{bb}\_F$, $Q_{bb}\_F$ and $QB_{bb}\_F$ that are 90° phase shifted with respect to one another are applied to each of the quadrature upconverters 120, 122, 124. As shown, quadrature upconverter 120 receives four phases 315, 135, 45, 225 of a local oscillator (not shown). Quadrature upconverter 122 receives four phases 0, 180, 90, 270 of the local oscillator. Quadrature upconverter 124 receives four phases 45, 225, 135, 315 of the local oscillator. Accordingly, the four phases of the LO signal received by quadrature upconverter 120 lead the corresponding phases of the LO signal received by quadrature upconverter 122 by 45°. Likewise, the four phases of the LO signal received by quadrature upconverter 124 lag the corresponding phases of the LO signal received by quadrature upconverter 122 by 45°.

Quadrature upconverter 120 performs frequency upconversion to generate RF signals $I_1$, $Q_1$; quadrature upconverter 122 performs frequency upconversion to generate RF signals $I_2$, $Q_2$; and quadrature upconverter 124 performs frequency upconversion to generate RF signals $I_3$, $Q_3$. Amplifier 130 amplifies signals $I_1/Q_1$ to generate a pair of complementary signals A and AB; amplifier 132 amplifies signals $I_2/Q_2$ to generate a pair of complementary signals B and BB; and amplifier 134 amplifies signals $I_3/Q_3$ to generate a pair of complementary signals C and CB.

Since the four phases of the local oscillator signal applied to quadrature upconverter 120 lead the corresponding phases of the local oscillator signal applied to quadrature upconverter 122 by 45°, signal $I_1$ leads signal $I_2$ by 45° and signal $Q_1$ leads signal $Q_2$ by 45°. Therefore, signal A leads signal C by 45° and signal AB leads signal CB by 45°. Likewise, because the four phases of the local oscillator signal applied to quadrature upconverter 124 lag the corresponding phases of the local oscillator signal applied to quadrature upconverter 122 by 45°, signal B lags signal C by 45° and signal BB lags signal CB by 45°.

Figure 2B:
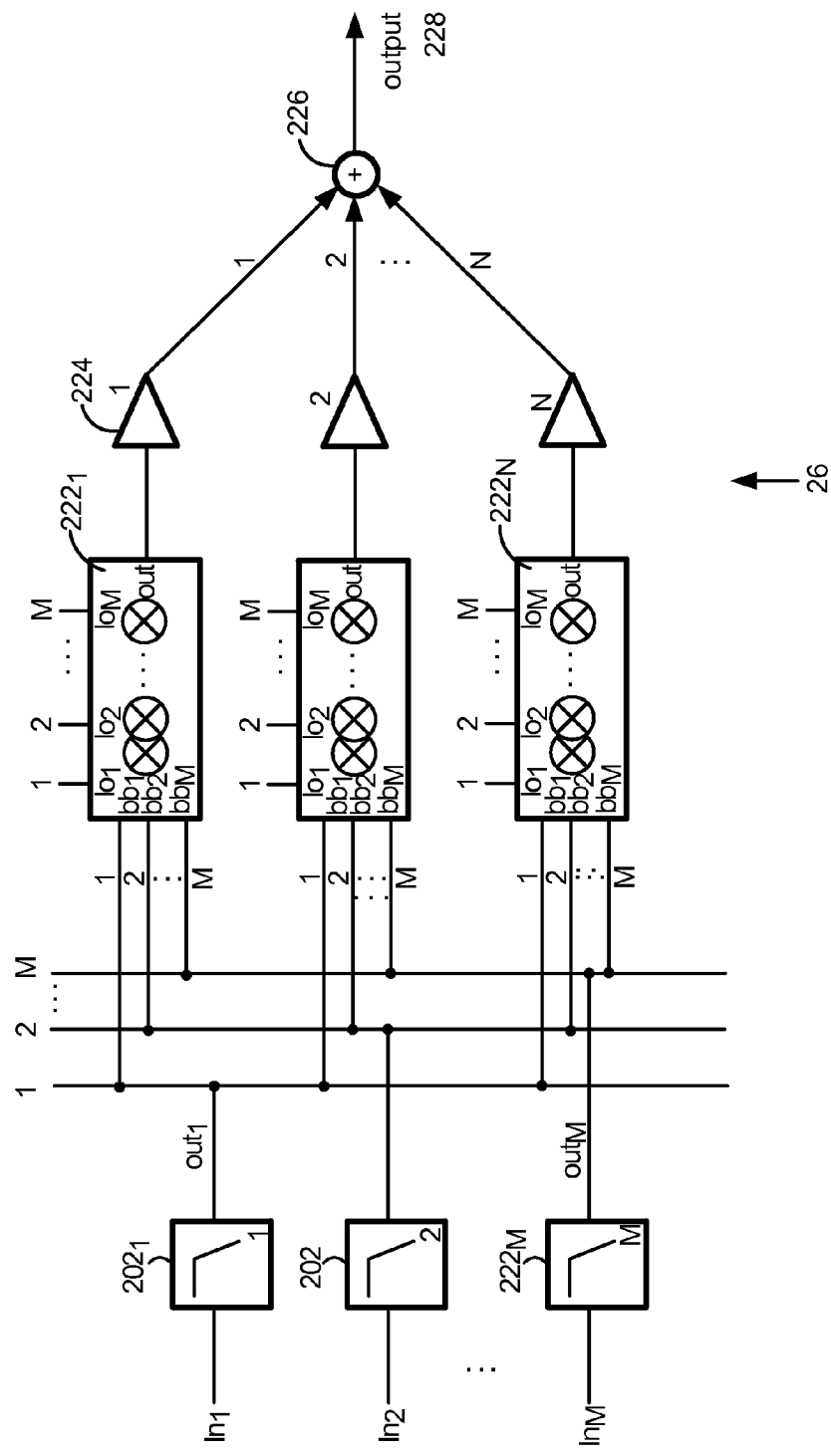
FIG. 2B is a generalized block diagram of the transmit chain illustrated in FIG. 2A, in accordance with one exemplary embodiment of the present invention.

FIG. 2B is a generalized block diagram of the transmit chain illustrated in FIG. 2A, in accordance with one exemplary embodiment of the present invention. As illustrated, in general, the transmit chain 26 may include M filters 202 each receiving one of the M input signals and output one of the output signals $out_1$ through $out_M$. Each output signal (e.g., $out_1$) may include a signal and its inverse. The output signals may enter the generalized upconverters $222_1$ through $222_N$. Each of the generalized upconverters 222 may include M/2 double balanced mixers. Output of the N upconverters 222 may be amplified with N amplifiers $224_1$ through $224_N$. The amplified signals may then be combined with the generalized combiner 226 to generate output 228.

Figure 3A:
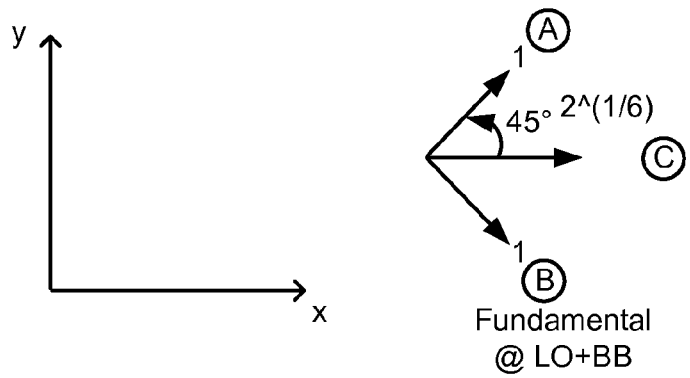
FIG. 3A shows the phasors corresponding to a number of signals of FIG. 2A at a fundamental frequency of (LO+BB) defined by the local oscillator frequency of LO and baseband frequency of BB), in accordance with one embodiment of the present invention.
Figure 3B:
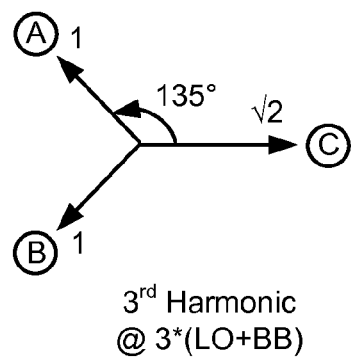
FIG. 3B shows the phasors corresponding to the signals of FIG. 3A at the third harmonic frequency of 3*(LO+BB), in accordance with one embodiment of the present invention.
Figure 3C:
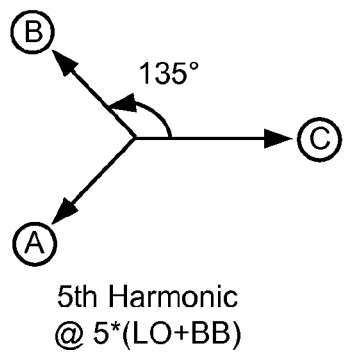
FIG. 3C shows the phasors corresponding to the signals of FIG. 3A at the fifth harmonic frequency of 5*(LO+BB), in accordance with one embodiment of the present invention.

FIG. 3A shows three phasors corresponding to signals A, B and C having a fundamental frequency defined by the local oscillator (LO) frequency of LO and baseband frequency of BB, namely LO+BB. As seen in FIG. 3A, at this fundamental frequency, signal A leads signal C by 45° and signal B lags signal C by 45°. FIGS. 3B and 3C show the same three phasors respectively at the third harmonic frequency of 3*(LO+BB), and fifth harmonic frequency of 5*(LO+BB). For the third harmonic, the difference between phases of signals C and A, or C and B is 3*45°=135°. For the fifth harmonic, the difference between phases of signals C and A, or C and B is 5*45°=225°.

Referring to FIG. 3A, it is seen that the three phasors corresponding to signals A, B, and C at the fundamental and desired frequency of LO+BB reinforce one another. Therefore, the output signal Outp of combiner 140, which is generated by combining/adding signals A, B, C, is enhanced at the fundamental frequency.

Referring to FIG. 3B, it is seen that in order to substantially suppress the third harmonic, the sum of the projections (magnitudes) of phasors A and B along the x-axis has to be equal to the magnitude of phasor C along the same axis. Assuming phasors A and B have a length of 1, because the angle between phasors C and A as well as the angle between phasors C and B is 135°, the x-component of each of phasors A and B has a length (value) of $$\frac{\sqrt{2}}{2}.$$

Therefore, the sum of the x-components of signals A and B at the third harmonic frequency is equal to $\sqrt{2}$. Consequently, to substantially eliminate the third harmonic, phasor C is selected to have a length that is $\sqrt{2}$ times the lengths of phasors A and B. This causes the three phasors to cancel each other along both the x and y axes. In order for phasor C to have a length (size) that is $\sqrt{2}$ times the length of phasors A and B, amplifier 132 is selected to have a gain that is $2^{1/6}$ times the gains of amplifiers 130, 134. Consequently, if amplifiers 130, 134 have a gain of G, amplifier 132 has a gain of $2^{1/6}*G$.

When amplifier 132 is selected to have a gain of $2^{1/6}*G$, the third harmonic of signals $I_2$ and $Q_2$ is amplified by a factor of $(2^{1/6})^3$—which is equal to $\sqrt{2}$. In other words, because amplifiers 130, 134 have a gain of G, whereas amplifier 132 has a gain of $(2^{1/6})$, the third harmonic of signal C has a magnitude that is greater than that of signals A and B by a factor of $(2^{1/6})^3$ which is equal to $\sqrt{2}$. Likewise, the third harmonic of signal CB has a magnitude that is larger than that of signals AB and BB by a factor of $\sqrt{2}$. Accordingly, as described above, output signal Outp that is generated by combining/adding signals A, B, C, has a substantially reduced component at the third harmonic frequency of 3*(LO+BB). Likewise, output signal Outn that is generated by combining/adding signals AB, BB, CB, has a substantially reduced component at the third harmonic frequency of 3*(LO+BB).

Referring to FIG. 3C, it is seen that the y-components of signals A and B cancel one another. Therefore, in order to substantially suppress the fifth harmonic, the sum of the x-components of phasors A and B has to be equal to the x-component of phasor C. Assuming phasors A and B have a length of 1, because the angle between phasors C and A as well as the angle between phasors C and B is 225°, the magnitude of each of phasors A and B along the x-axis is $$\frac{\sqrt{2}}{2}.$$

Consequently, to substantially eliminate the fifth harmonic, phasor C is selected to have a length that is $\sqrt{2}$ times the length of phasors A and B. This causes the three phasors to cancel each other along both the x and y axes. For phasor C to have a length that is $\sqrt{2}$ times the length of phasors A and B, amplifier 132 is selected to have a gain that is $2^{1/10}$ times the gains of amplifiers 130, 134. Consequently, if amplifiers 130, 134 have a gain of G, amplifier 132 has a gain of $2^{1/10}*G$.

When amplifier 132 is selected to have a gain of $2^{1/10}*G$, the fifth harmonic of signals $I_2$ and $Q_2$ is amplified by a factor of $(2^{1/10})^5$—which is equal to $\sqrt{2}$. In other words, because amplifiers 130, 134 have a gain of G, whereas amplifier 132 has a gain of $(2^{1/10})$, the fifth harmonic of signal C has a magnitude that is larger than that of signals A and B by a factor of $(2^{1/10})^5$ which is equal to $\sqrt{2}$. Likewise, the fifth harmonic of signal CB has a magnitude that is larger than that of signals AB and BB by a factor of $\sqrt{2}$. Accordingly, output signal Outp that is generated by combining/adding signals A, B, C (using combiner 140) has a substantially reduced component at the fifth harmonic frequency of 5*(LO+BB). Likewise, output signal Outn that is generated by combining/adding signals AB, BB, CB (using combiner 142) has a substantially reduced component at the fifth harmonic frequency of 5*(LO+BB). Consequently, in accordance with the present invention, by adjusting the gain of amplifier 132 relative to the gains of amplifiers 130 and 134, the undesired harmonics caused by non-linearity of the amplifiers is substantially suppressed.

Figure 4A:
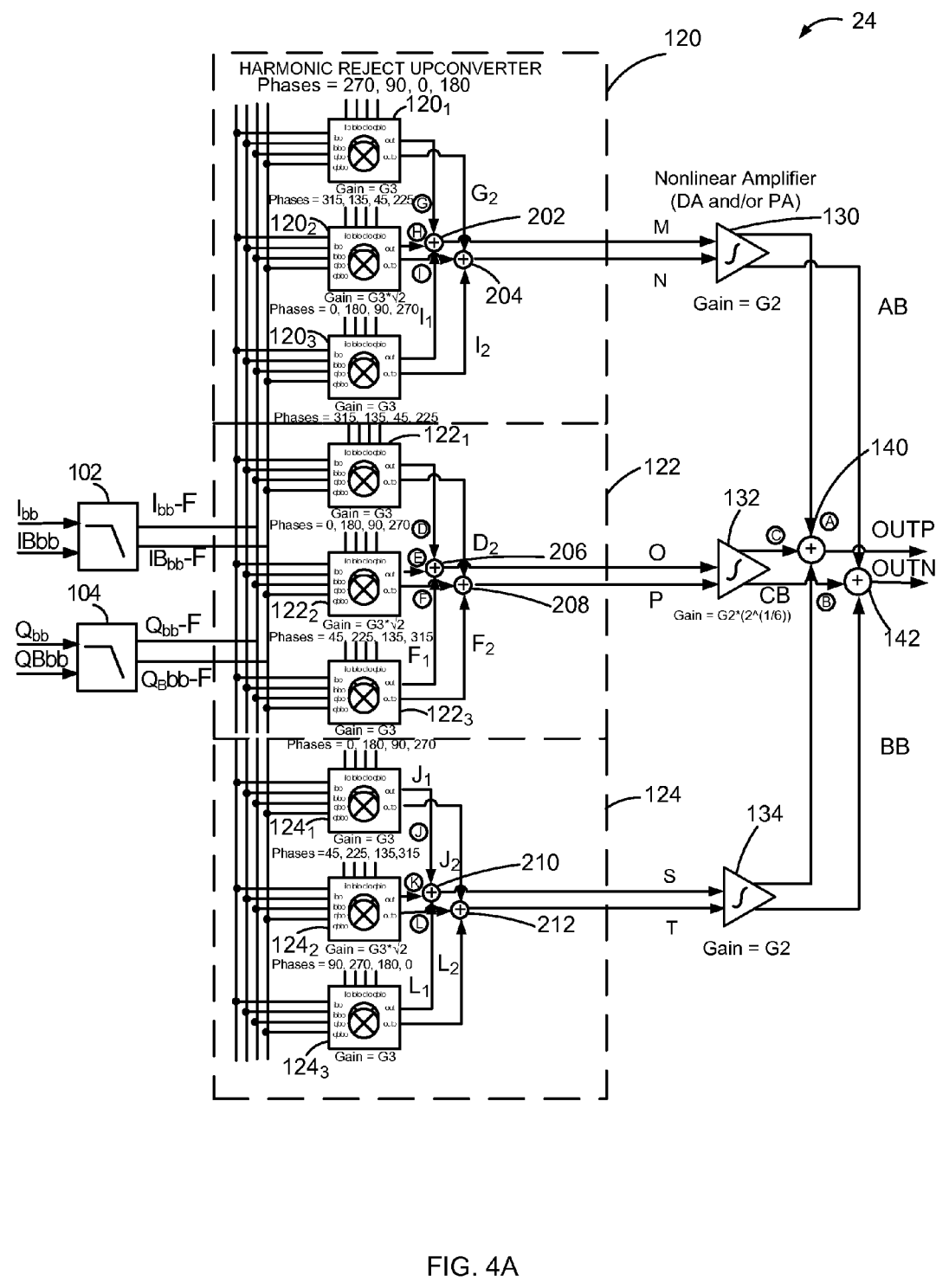

In one embodiment, each of the frequency upconverters 120, 122, 124 may be a composite harmonic-rejective frequency upconverter that, in turn, includes a multitude of upconverters. FIG. 4A is a block diagram of another exemplary embodiment of a frequency upconverter. Transmit chain 24 of FIG. 4A is shown as including, in part, filters 102, 104, quadrature upconverters $120_1$, $120_2$, $120_3$ collectively forming upconverter 120, quadrature upconverters $122_1$, $122_2$, $122_3$ collectively forming upconverter 122, quadrature upconverters $124_1$, $124_2$, $124_3$ collectively forming upconverter 124, driver amplifiers 130, 132, 134, and combiners 202, 204, 206, 208, 210, 212, 140, 142.

Transmit chain 24 of FIG. 4A is adapted to upconvert the frequency of the signals it receives and suppress the third harmonic frequency of 3*(LO+BB) or fifth harmonic frequency of 5*(LO+BB), as described above in reference to FIGS. 2 and 3A-3C. Transmit chain 24 of FIG. 4A is further adapted to suppress the third order spurious mixing product of 3*LO-BB caused by the upconverters, the fifth order spurious mixing product of 5*LO+BB caused by the upconverters, as well as the undesired counter-IM3 product of LO-3*BB caused by the driver amplifiers. While the embodiment of FIG. 4A is described with reference to a frequency upconversion circuit having 3 sets of upconverters 120, 122, 124 each set having 3 upconverters (for a total of 9 upconverters), it is understood that other embodiments may have N sets of upconverters with each set including Q upconverters, where N and Q are positive integers. Furthermore, while the frequency upconversion circuit of FIG. 4A is shown as receiving 9 sets of phases of the LO signal with each set including 4 different phases of the LO signal, it is understood that other embodiments may receive N×Q sets of phases of a LO signal with each set including M different phases of the LO signal, where N, Q and M are positive integers. For certain embodiments, some of the N×Q sets of phases of the LO signal may be distinct and some of the sets may be similar to one another. For example, if N=3 and Q=3, out of 9 sets of phases of the LO signal, 5 sets may be distinct and 4 sets may be duplicate of the other sets.

Filter 102 filters out undesired signals from the I-channel baseband signals $I_{bb}$ and $IB_{bb}$ to generate filtered baseband signals $I_{bb}\_F$ and $IB_{bb}\_F$. Signals $I_{bb}$ and $IB_{bb}$ are inverse of one another. Likewise, filter 104 filters out undesired signals from Q-channel baseband signals $Q_{bb}$ and $QB_{bb}$ to generate filtered baseband signals $Q_{bb}\_F$ and $QB_{bb}\_F$. The four filtered baseband signals $I_{bb}\_F$, $IB_{bb}\_F$, $Q_{bb}\_F$ and $QB_{bb}\_F$ that are 90° phase shifted with respect to one another are applied to each of the quadrature upconverters $120_1$, $120_2$, $120_3$, $122_1$, $122_2$, $122_3$, $124_1$, $124_2$, $124_3$.

As shown, upconverter $120_1$ receives four phases 270, 90, 0, 180 of the local oscillator; upconverter $120_2$ receives four phases 315, 135, 45, 225 of the local oscillator; upconverter $120_3$ receives four phases 0, 180, 90, 270, of the local oscillator; upconverter $122_1$ receives four phases 315, 135, 45, 225 of the local oscillator; upconverter $122_2$ receives four phases 0, 180, 90, 270 of the local oscillator; upconverter $122_3$ receives four phases 45, 225, 135, 315 of the local oscillator; upconverter $124_1$ receives four phases 0, 180, 90, 270 of the local oscillator; upconverter $124_2$ receives four phases 45, 225, 135, 315 of the local oscillator; and upconverter $124_3$ receives four phases 90, 270, 180, 0 of the local oscillator (LO).

Accordingly, the four phases of the LO signal received by upconverter $120_1$ lead the corresponding phases of the LO signal received by upconverter $120_2$ by 45°, and the four phases of the LO signal received by upconverter $120_3$ lag the corresponding phases of the LO signal received by quadrature upconverter $120_2$ by 45°. Similarly, the four phases of the LO signal received by upconverter $122_1$ lead the corresponding phases of the LO signal received by upconverter $122_2$ by 45°, and the four phases of the LO signal received by upconverter $122_3$ lag the corresponding phases of the LO signal received by quadrature upconverter $122_2$ by 45°. Likewise, the four phases of the LO signal received by upconverter $124_1$ lead the corresponding phases of the LO signal received by upconverter $124_2$ by 45°, and the four phases of the LO signal received by upconverter $124_3$ lag the corresponding phases of the LO signal received by quadrature upconverter $124_2$ by 45°.

Furthermore, the four phases of the LO signal received by upconverter $120_i$ lead the corresponding phases of the LO signal received by quadrature upconverter $122_i$ by 45°, where i is an integer varying from 1 to 3 in this exemplary embodiment. For example, the four phases 315, 135, 45, 225 of the LO signal received by upconverter $120_2$ lead the corresponding four phases 0, 180, 90, 270 of the LO signal received by quadrature upconverter $122_2$ by 45°. Likewise, the four phases of the LO signal received by upconverter $124_i$ lag the corresponding phases of the LO signal received by quadrature upconverter $122_i$ by 45°. For example, the four phases 45, 225, 135, 315 of the LO signal received by upconverter $124_2$ lag the corresponding phases 0, 180, 90, 270 of the LO signal received by quadrature upconverter $122_2$ by 45°.

Upconverter $120_1$ performs frequency upconversion to generate upconverted in-phase and inverse RF signals $G_1$, $G_2$; upconverter $120_2$ performs frequency upconversion to generate upconverted in-phase and inverse RF signals $H_1$, $H_2$; upconverter $120_3$ performs frequency upconversion to generate upconverted in-phase and its inverse RF signals $I_1$, $I_2$, upconverter $122_1$ performs frequency upconversion to generate upconverted in-phase and inverse RF signals $D_1$, $D_2$; upconverter $122_2$ performs frequency upconversion to generate upconverted in-phase and inverse RF signals $E_1$, $E_2$; upconverter $122_3$ performs frequency upconversion to generate upconverted in-phase and inverse RF signals $F_1$, $F_2$; upconverter $124_1$ performs frequency upconversion to generate upconverted in-phase and inverse RF signals $J_1$, $J_2$; upconverter $124_2$ performs frequency upconversion to generate upconverted in-phase and inverse RF signals $K_1$, $K_2$; and upconverter $124_3$ performs frequency upconversion to generate upconverted in-phase and inverse RF signals $L_1$, $L_2$.

Combiner 202 is adapted to add/combine signals $G_1$, $H_1$, $I_1$ to generate signal M; combiner 204 is adapted to add/combine signals $G_2$, $H_2$, $I_2$ to generate signal N; combiner 206 is adapted to add/combine signals $D_1$, $E_1$, $F_1$ to generate signal O; combiner 208 is adapted to add/combine signals $D_2$, $E_2$, $F_2$ to generate signal p; combiner 210 is adapted to add/combine signals $J_1$, $K_1$, $L_1$ to generate signal S; and combiner 212 is adapted to add/combine signals $J_2$, $K_2$, $L_2$ to generate signal T. Amplifier 130 amplifies signals M and N to generate a pair of complementary signals A and AB; amplifier 132 amplifies signals O and P to generate a pair of complementary signals B and BB; and amplifier 134 amplifies signals S and T to generate a pair of complementary signals C and CB.

Since the four phases of the local oscillator signal applied to quadrature upconverter $120_1$ lead the corresponding phases of the local oscillator signal applied to quadrature upconverter $120_2$ by 45°, signals $G_1$ and $G_2$ respectively lead signals $H_1$ and $H_2$ by 45°. Likewise, because the four phases of the local oscillator signal applied to quadrature upconverter $120_3$ lag the corresponding phases of the local oscillator signal applied to quadrature upconverter $120_2$ by 45°, signals $I_1$ and $I_2$ respectively lag signals $H_1$ and $H_2$ by 45°. For the same reason, signals $D_1$ and $D_2$ respectively lead signals $E_1$ and $E_2$ by 45°, and signals $F_1$ and $F_2$ respectively lag signals $E_1$ and $E_2$ by 45°. Likewise, signals $J_1$ and $J_2$ respectively lead signals $K_1$ and $K_2$ by 45°, and signals $L_1$ and $L_2$ respectively lag signals $K_1$ and $K_2$ by 45°.

Figure 4B:
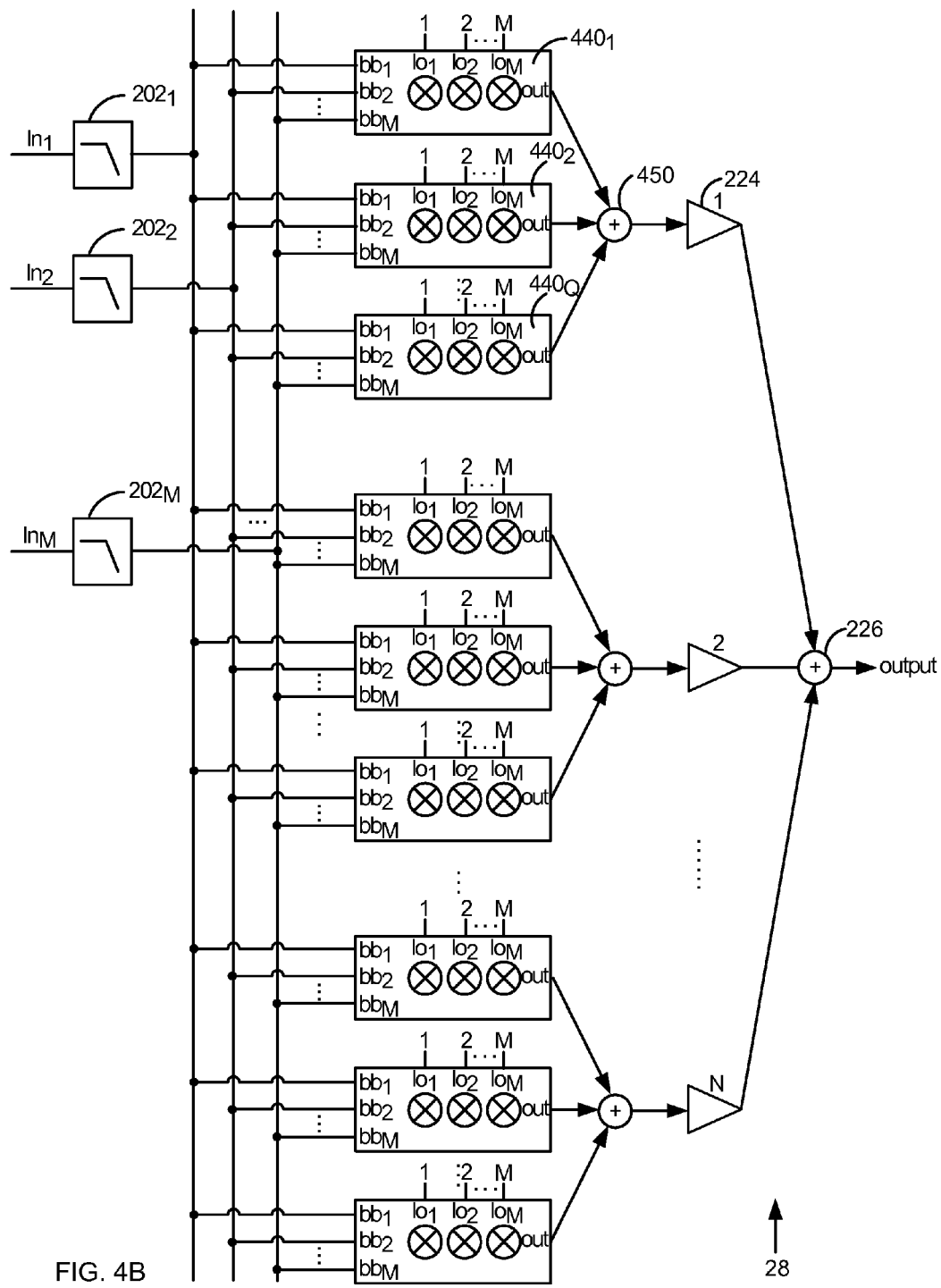
FIG. 4B is a generalized block diagram of the transmit chain illustrated in FIG. 4A, in accordance with one exemplary embodiment of the present invention.

FIG. 4B is a generalized block diagram of the transmit chain illustrated in FIG. 4A, in accordance with one exemplary embodiment of the present invention. As illustrated, in general, the transmit chain 28 may include M filters 202 each receiving one of the M input signals and output one of the output signals $out_1$ through $out_M$. Each output signal (e.g., $out_1$) may include a signal and its inverse. The output signals may enter each of the N sets of the generalized upconverters (e.g., $440_1$ through $440_Q$). Each of the generalized upconverters 440 may include M/2 double balanced mixers or M single balanced mixers. Output of the Q upconverters 440 may be combined with combiner 450 before being amplified with amplifier $224_1$. Outputs of the N amplifiers $224_1$ through $224_N$ may then be combined with the generalized combiner 226 to generate output 228.

Figure 5A:
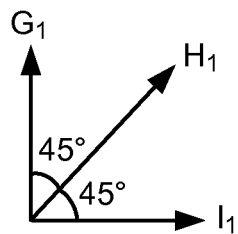
FIGS. 5A-5C show the phasors corresponding to a number of transmit signals of FIG. 4A at a fundamental frequency of (LO+BB) defined by the local oscillator frequency of LO and baseband frequency of BB), in accordance with one embodiment of the present invention.
Figure 5B:
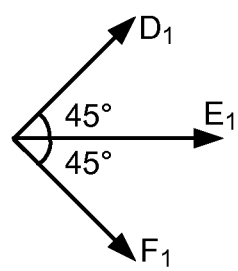
Figure 5C:
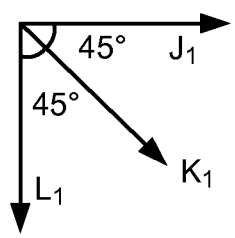

FIG. 5A shows three phasors associated with signals $I_1$, $G_1$ and $H_1$ having a fundamental frequency defined by the local oscillator (LO) frequency of LO and baseband frequency of BB, namely LO+BB. As seen in FIG. 5A, at this fundamental frequency, signal $G_1$ leads signal $H_1$ by 45° and signal $I_1$ lags signal $H_1$ by 45°. FIG. 5B shows three phasors associated with signals $E_1$, $F_1$ and $D_1$ having a fundamental frequency of LO+BB. As seen in FIG. 5B, at this fundamental frequency, signal $D_1$ leads signal $E_1$ by 45° and signal $F_1$ lags signal $E_1$ by 45°. FIG. 5C shows three phasors associated with signals $J_1$, $K_1$ and $L_1$ having a fundamental frequency of LO+BB. As seen in FIG. 5C, at this fundamental frequency, signal $J_1$ leads signal $K_1$ by 45° and signal $L_1$ lags signal $K_1$ by 45°.

Figure 6A:
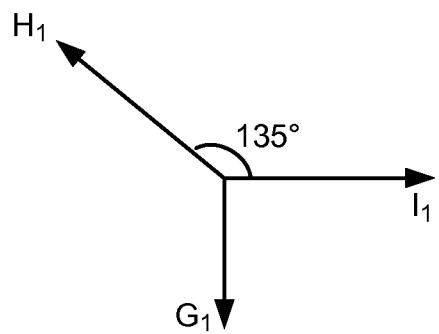
FIGS. 6A-6C show the phasors corresponding to the signals of FIGS. 5A-5C at the third order spurious upconversion product frequency of (3*LO−BB), in accordance with one embodiment of the present invention.
Figure 6B:
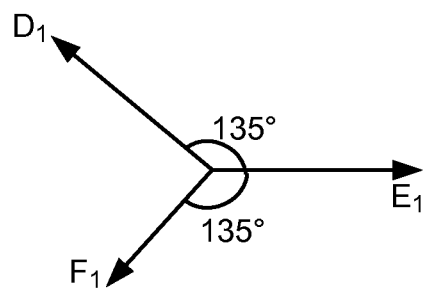
Figure 6C:
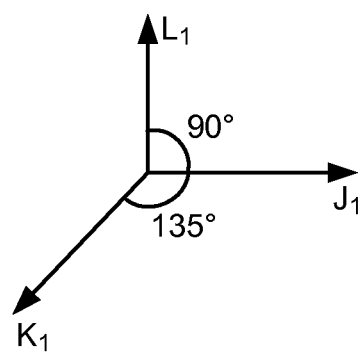

FIG. 6A shows the three phasors associated with signals $G_1$, $H_1$, $I_1$ at the spurious upconversion mixing product frequency of (3\*LO−BB). The value (amplitude) of signal $H_1$ is selected to be $\sqrt{2}$ times greater than the value of each of signals $G_1$ and $I_1$. Thus, the y-component of signal $H_1$ cancels signal $G_1$, and the x-component of signal $H_1$ cancels signal $I_1$. FIG. 6B shows the three phasors associated with signals $D_1$, $E_1$, $F_1$ at the spurious upconversion mixing product frequency of (3\*LO−BB). The value of signal $E_1$ is selected to be $\sqrt{2}$ times greater than the value of each of signals $D_1$ and $F_1$. Thus, the y-components of signals $D_1$ and $F_1$ cancel each other. Furthermore, the sum of the x-components of signals $D_1$ and $F_1$ cancel signal $E_1$. FIG. 7C shows the three phasors associated with signals $J_1$, $K_1$, $L_1$ at the spurious upconversion mixing product frequency of (3\*LO−BB). The value of signal $K_1$ is selected to be $\sqrt{2}$ times greater than the value of each of signals $L_1$ and $J_1$. Thus, the x-component of signal $K_1$ cancels signal $J_1$, and the y-component of signals $K_1$ cancels signal $L_1$. Accordingly, the spurious upconversion mixing product at frequency (3\*LO−BB) is substantially reduced at (i) the outputs M and N of combiners 202, 204, (ii) the outputs O and P of combiners 206, 208; and (iii) the outputs S, T of combiners 201, 212. In other words, in accordance with one aspect of the present invention, the spurious upconversion mixing products at frequency (3\*LO−BB) is canceled or substantially reduced at the outputs of combiners, i.e., at the inputs of amplifiers 130, 132, 134.

Figure 7A:
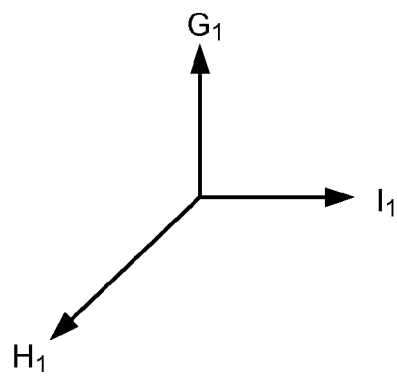
FIGS. 7A-7C show the phasors corresponding to the signals of FIGS. 5A-5C at the fifth order spurious upconversion product frequency of (5*LO+BB), in accordance with one embodiment of the present invention.
Figure 7B:
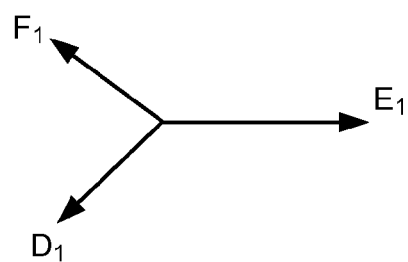
Figure 7C:
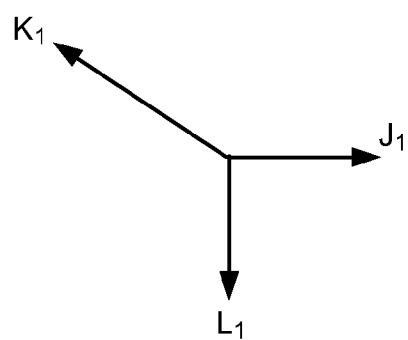

FIG. 7A shows the three phasors associated with signals $G_1$, $H_1$, $I_1$ at the spurious upconversion product frequency of (5\*LO+BB). The value of signal $H_1$ is selected to be $\sqrt{2}$ times greater than the value of each of signals $G_1$ and $H_1$. Thus, the y-component of signal $H_1$ cancels signal $G_1$, and the x-component of signal $H_1$ cancels signal $I_1$. FIG. 7B shows the three phasors associated with signals $D_1$, $E_1$, $F_1$ at the spurious upconversion product frequency of (5\*LO+BB). The value of signal $E_1$ is selected to be $\sqrt{2}$ times greater than the value of each of signals $D_1$ and $F_1$. Thus, the y-components of signals $D_1$ and $F_1$ cancel each other. Furthermore, the sum of the x-components of signals $D_1$ and $F_1$ cancel signal $E_1$.

FIG. 7C shows the three phasors associated with signals $J_1$, $K_1$, $L_1$ at the spurious upconversion product frequency of (5\*LO+BB). The value of signal $K_1$ is selected to be $\sqrt{2}$ times greater than the value of each of signals $L_1$ and $J_1$. Thus, the x-component of signal $K_1$ cancels signal $J_1$, and the y-component of signals $K_1$ cancels signal $L_1$. Accordingly, the spurious upconversion products at frequency (5\*LO+BB) is substantially canceled at (i) the outputs M and N of combiners 202, 204, (ii) the outputs O and P of combiners 206, 208; and (iii) the outputs S, T of combiners 201, 212. In other words, in accordance with one aspect of the present invention, the spurious upconversion product at frequency (5\*LO+BB) is canceled or substantially reduced at the outputs of combiners, i.e., at the inputs of the amplifiers.

It should be noted that the proposed method also rejects undesired components at frequency LO−3BB. The undesired components at frequency LO−3BB are generated because of the presence of third order nonlinearity in amplifiers 130,132, 134 as a result of intermodulation of input signals with spectral components at LO+BB and 3\*LO−BB. The embodiment as illustrated in FIG. 4A, rejects 3\*LO−BB components by design at the combiner outputs 202, 204, 206, 208, 210 and 212. As a result of this rejection of the 3\*LO−BB component, no substantial LO−3\*BB product can be generated at the outputs of amplifiers 130, 132, 134.

Figure 8:
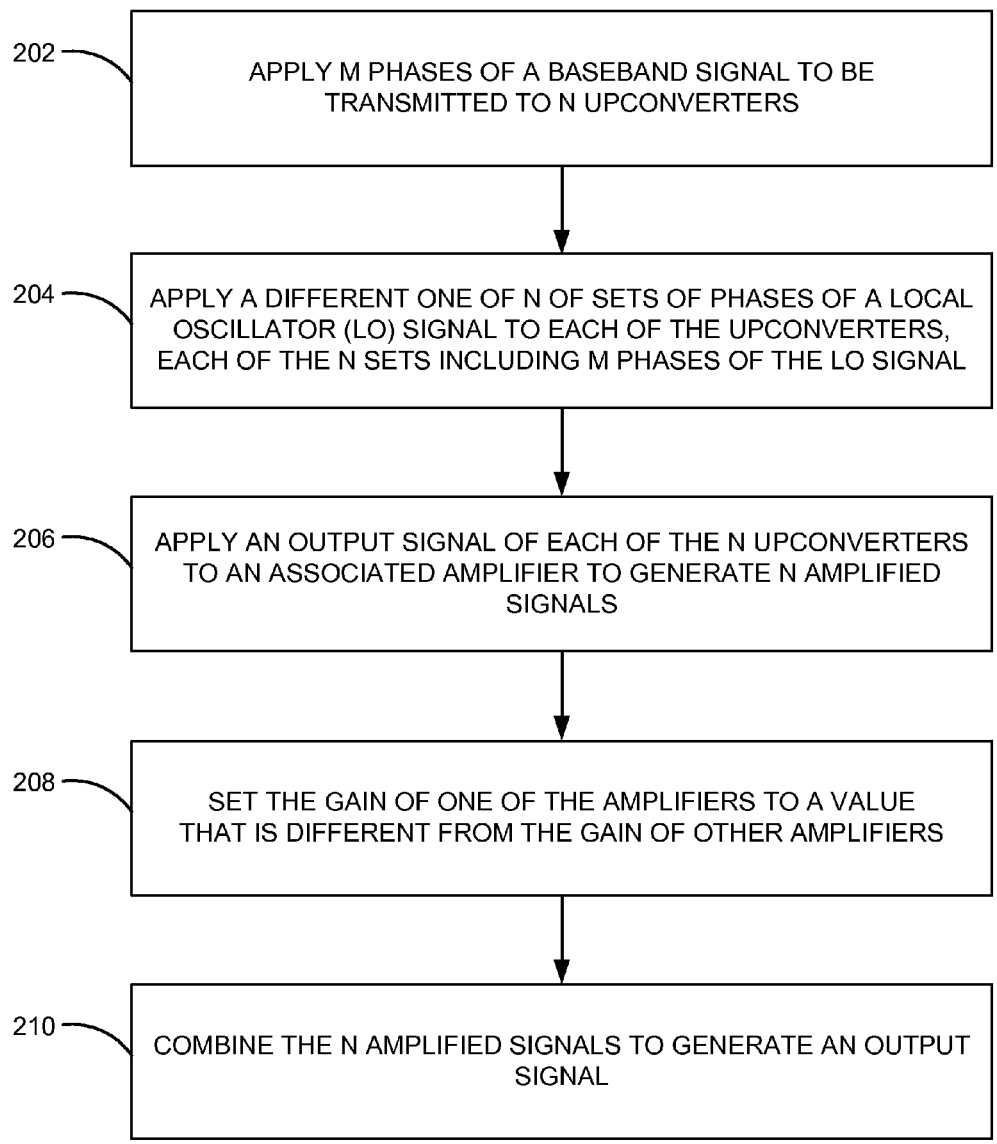
FIG. 8 is a flowchart for transmitting a signal, in accordance with one embodiment of the present invention.

FIG. 8 is a flowchart 200 for a communication method, in accordance with one embodiment of the present invention. To perform the communication, M phases of a signal to be transmitted are applied 202 to N upconverters. One of N sets of phases of a LO signal are also applied 204 to each of the N upconverters. Each of the N sets of phases includes a different one of M phases of the LO signal. The output of each upconverter is applied 206 to an associated amplifier to generate N amplified signals. The gain of at least one of the amplifiers is set 208 to a value that is different from the gain of the remaining amplifiers. The amplified signals are combined 216 to generate an output signal that has a substantially reduced harmonics of the upconverted signal to be transmitted.

Figure 9:
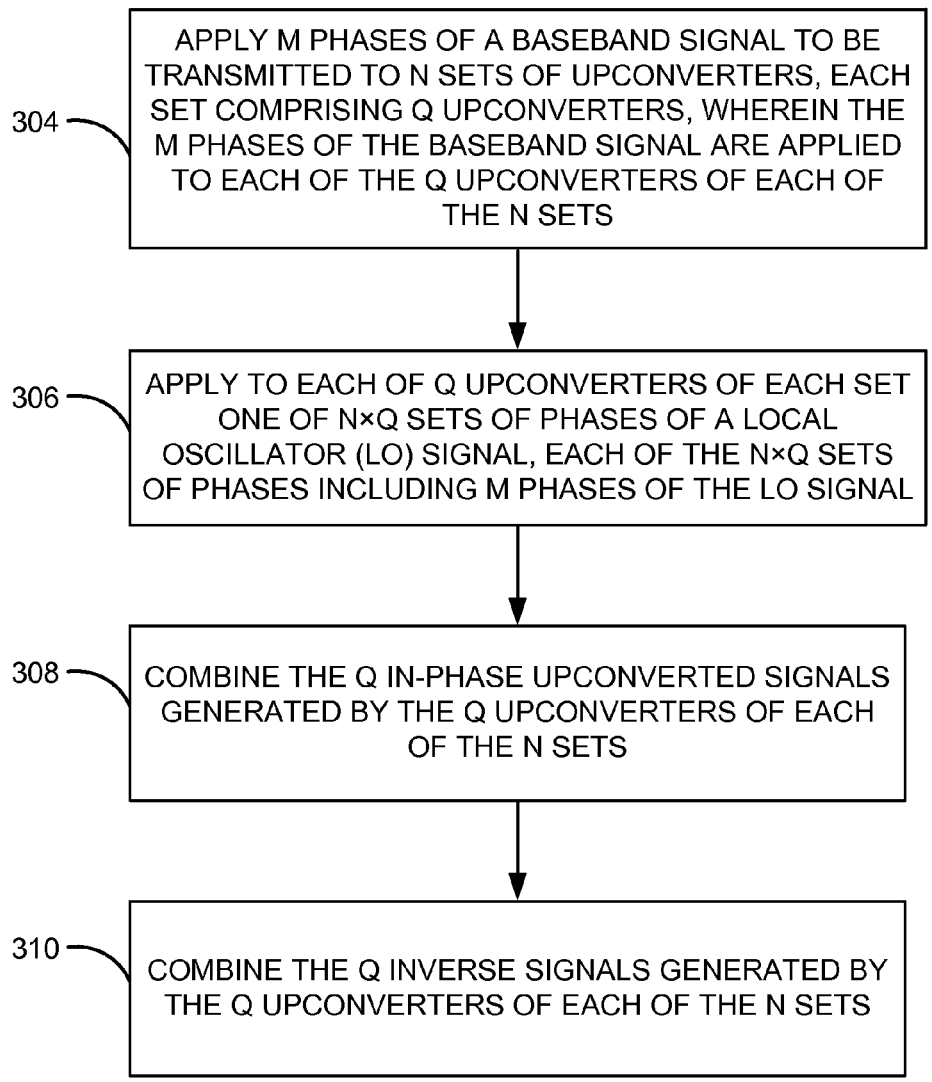
FIG. 9 is a flowchart for transmitting a signal, in accordance with another embodiment of the present invention.

FIG. 9 is a flowchart 200 for a communication method, in accordance with one embodiment of the present invention. To perform the communication, M phases of a signal to be transmitted are applied 304 to N sets of upconverters. Each of the N sets includes Q upconverters. As illustrated, the M phases of the signal are applied to each of the Q upconverters of each of the N sets. One of N×Q sets of phases of a local oscillator signal are also applied 306 to each of the N×Q upconverters. Each of the N×Q sets includes M phases of the LO signal. Each of the Q upconverters generates an upconverted in-phase signal and an upconverted inverse signal in response. Thereafter, the Q in-phase signals generated by the Q upconverters of each of the N sets are combined 308 to generate N combined in-phase signals. The Q inverse signals generated by the Q upconverters of each of the N sets are also combined 310 to generate N combined inverse signals.

The above embodiments of the present invention are illustrative and not limitative. The embodiments of the present invention are not limited by the number of upconverters, the number of sets of LO phases, or the number of LO phases in each such set. Nor are the embodiments of the present invention limited by any particular phases of the local oscillator used in each set. Other additions, subtractions or modifications are obvious in view of the present disclosure and are intended to fall within the scope of the appended claims.

What is claimed is:

1. A communication device having a transmission path comprising:
    N upconverters each receiving M phases of a baseband signal to be transmitted, each upconverter further receiving a different one of N sets of phases of a local oscillator (LO) signal, each of the N sets comprising M different phases of the LO signal;
    N amplifiers each responsive to a different one of the N upconverters to generate N amplified signals; and
    at least one combiner adapted to combine the N amplified signals to generate an output signal, wherein a frequency component falling at a multiple of a sum of a LO signal frequency and a baseband signal frequency, or a multiple of a difference between the LO signal frequency and the baseband signal frequency is substantially suppressed from the output signal by selecting a gain of at least a first one of the N amplifiers to be different from a gain of a remaining one of the N amplifiers, wherein N and M are integers greater than 1.

2. The communication device of claim 1 further comprising:
    a first filter receiving a baseband in-phase signal to generate a first filtered in-phase signal to be transmitted to the N upconverters; and
    a second filter receiving a baseband quadrature-phase signal to generate a second filtered quadrature-phase signal to be transmitted to the N upconverters.

3. The communication device of claim 2 wherein said baseband in-phase signal comprises a first pair of complementary signals and wherein said baseband quadrature-phase signal comprises a second pair of complementary signals.

4. The communication device of claim 1 wherein N is 3 and M is 4.

5. The communication device of claim 4 wherein to eliminate a third harmonic, first and second amplifiers are selected to have an equal gain and a third amplifier is selected to have a gain larger than the gain of the first and second amplifiers.

6. The communication device of claim 5 wherein the gain of the third amplifier is substantially $2^{1/6}$ times the gain of the first and second amplifiers.

7. The communication device of claim 5 wherein the gain of the third amplifier is substantially $2^{1/10}$ times the gain of the first and second amplifiers.

8. The communication device of claim 5 wherein the four phases of the LO signal in a first set lead corresponding four phases of the LO signal in a second set by 45°.

9. The communication device of claim 8 wherein the four phases of the LO signal in a third set lag corresponding four phases of the LO signal in the second set by 45°.

10. The communication device of claim 9 wherein the 4 phases of the LO signal in the first set are 315, 135, 45, 225 degrees the 4 phases of the LO signal in the second set are 0, 180, 90, 270 degrees and the 4 phases of the LO signal in the third set are 45, 225, 135, 315 degrees.

11. A communication device having a transmission path comprising:
    N sets of upconverters each set comprising Q upconverters, each of the Q upconverters in each of the N sets receiving M phases of a baseband signal to be transmitted, each of the Q upconverters in each of the N sets further receiving one of N×Q sets of phases of a local oscillator (LO) signal, each of the N×Q sets comprising M phases of the LO signal, each of the Q upconverters generating an upconverted in-phase signal and an upconverted inverse signal; and
    N sets of combiners each set associated with a different one of the N sets of upconverters, wherein a first combiner in each set combines the Q in-phase signals the first combiner receives from its associated upconverters, and wherein a second combiner in each set combines the Q inverse signals the second combiner receives from its associated upconverters, wherein Q, M and N are positive integers greater than 1, wherein a frequency component falling at a multiple of a sum of the LO signal and the baseband signal, or a multiple of a difference between the LO signal and the baseband signal is substantially suppressed from combined in-phase and inverse signals.

12. The communication device of claim 11 further comprising:
    a first filter receiving a baseband in-phase signal to generate a first filtered in-phase signal to be transmitted to the N sets of upconverters; and
    a second filter receiving a baseband quadrature-phase signal to generate a second filtered quadrature-phase of the signal to be transmitted to the N sets of upconverters.

13. The communication device of claim 12 wherein said baseband in-phase signal comprises a first pair of complementary signals and wherein said baseband quadrature-phase signal comprises a second pair of complementary signals.

14. The communication device of claim 11 wherein each of N and Q are equal to three.

15. The communication device of claim 14 wherein N×Q sets of phases of the LO signal comprise 5 distinct sets, and M is equal to 4.

16. The communication device of claim 11 further comprising:
    N amplifiers each associated with a different one of the N sets of combiners, each amplifier adapted to amplify the signal and its inverse that it receives from its associated set of combiners.

17. The communication device of claim 16 wherein a gain of at least one of the amplifier is substantially $2^{1/6}$ times the gain of remaining (N−1) amplifiers.

18. The communication device of claim 16 wherein a gain of at least one of the amplifier is substantially $2^{1/10}$ times the gain of remaining (N−1) amplifiers.

19. The communication device of claim 15 wherein the 4 phases of the LO signal received by a first upconverter in each of the N sets lead corresponding 4 phases of the LO signal received by a second upconverter in the set by 45°, and the 4 phases of the LO signal received by a third upconverter in each of the N sets lag the corresponding 4 phases of the LO signal received by the second upconverter in the set by 45°.

20. The communication device of claim 19 wherein the 4 phases of the LO signal in the first set are 270, 90, 0, 180 degrees, the 4 phases of the LO signal in the second set are 315, 135, 45, 225 degrees, the 4 phases of the LO signal in the third are 0, 180, 90, 270 degrees, the 4 phases of the LO signal in the fourth set are 45, 225, 135, 315 degrees, and the 4 phases of the LO signal in the fifth set are 90, 270, 180, 0 degrees.

21. A method of communication comprising:
applying M phases of a baseband signal to be transmitted to N upconverters;
applying a different one of N sets of phases of a local oscillator (LO) signal to each of the N upconverters, each of the N sets comprising M different phases of the LO signal;
applying an output signal of each of the N upconverters to a different one of N associated amplifiers to generate N amplified signals;
selecting a gain of at least a first one of the N amplifiers to be different from a gain of a remaining one of the N amplifiers; and
combining the N amplified signals to generate an output signal, wherein a frequency component falling at a multiple of a sum of a LO signal frequency and a baseband signal frequency, or a multiple of a difference between the LO signal frequency and the baseband signal frequency is substantially suppressed from the output signal, and wherein N and M are integers greater than 1.

22. The method of claim 21 further comprising:
filtering a baseband in-phase signal to generate a first filtered in-phase signal to be transmitted to the N upconverters; and
filtering a baseband quadrature-phase signal to generate a second filtered quadrature-phase signal to be transmitted to the N upconverters.

23. The method of claim 22 wherein said baseband in-phase signal comprises a first pair of complementary signals and wherein said baseband quadrature-phase signal comprises a second pair of complementary signals.

24. The method of claim 21 wherein N is 3 and M is 4.

25. The method of claim 24 wherein to eliminate a third harmonic, first and second amplifiers are selected to have equal gains and a third amplifier is selected to have a gain larger than the gain of the first and second amplifiers.

26. The method of claim 25 wherein the gain of third amplifier is selected to be substantially $2^{1/6}$ times the gain of the first and second amplifiers.

27. The method of claim 25 wherein the gain of third amplifier is selected to be substantially $2^{1/10}$ times the gain of the first and second amplifiers.

28. The method of claim 25 wherein the 4 phases of the LO signal in a first set lead corresponding phases of the LO signal in a second set by 45°.

29. The method of claim 28 wherein the 4 phases of the LO signal in a third set lag corresponding phases of the LO signal in the second set by 45°.

30. The method of claim 29 wherein the 4 phases of the LO signal in the first set are 315, 135, 45, 225 degrees, the 4 phases of the LO signal in the second set are 0, 180, 90, 270 degrees, and the 4 phases of the LO signal in the third set are 45, 225, 135, 315 degrees.

31. A method of communication comprising:
applying M phases of a baseband signal to be transmitted to N sets of upconverters, each set comprising Q upconverters, wherein the M phases of the baseband signal are applied to each of the Q upconverters of each of the N sets;
applying to each of the Q upconverters of each of the N sets one of N×Q sets of phases of a local oscillator (LO) signal, each of the N×Q sets comprising M phases of the LO signal, each of the Q upconverters generating upconverted signal and inverse signal;
combining the Q in-phase upconverted signals generated by the Q converters of each of the N sets thereby to generate N combined in-phase upconverted signals; and
combining the Q inverse signals generated by the Q converters of each of the N sets thereby to generate N combined inverse signals, wherein a frequency component falling at a multiple of a sum of a LO signal frequency and a baseband signal frequency, or a multiple of a difference between the LO signal frequency and the baseband signal frequency is substantially suppressed from the combined in-phase and inverse signals, wherein Q, M and N are positive integers greater than 1.

32. The method of claim 31 further comprising:
filtering a baseband in-phase signal to generate a first filtered in-phase signal to be transmitted to the N sets of upconverters; and
filtering a baseband quadrature-phase signal to generate a second quadrature-phase signal to be transmitted to the N sets of upconverters.

33. The method of claim 32 wherein said baseband in-phase signal comprises a first pair of complementary signals and wherein said baseband quadrature-phase signal comprises a second pair of complementary signals.

34. The method of claim 33 wherein each of N and Q are equal to three.

35. The method of claim 34 wherein N×Q sets of phases of the LO signal comprise 5 distinct sets, and M is equal to 4.

36. The method of claim 31 further comprising:
amplifying each of the N combined in-phase signals; and
amplifying each of the N combined inverse signals.

37. The method of claim 36 wherein at least one of the amplifications is substantially $2^{1/6}$ times the remaining amplifications.

38. The method of claim 36 wherein at least one of the amplifications is substantially $2^{1/10}$ times the remaining amplifications.

39. The method of claim 35 wherein the 4 phases of the LO signal received by a first upconverter in each of the N sets lead corresponding 4 phases of the LO signal received by a second upconverter in the set by 45°, and the 4 phases of the LO signal received by a third upconverter in each of the N sets lag the corresponding 4 phases of the LO signal received by the second upconverter in the set by 45°.

40. The method of claim 39 wherein the 4 phases of the LO signal in the first are 270, 90, 0, 180 degrees, the 4 phases of the LO signal in the second set are 315, 135, 45, 225 degrees, the 4 phases of the LO signal in the third are 0, 180, 90, 270 degrees, the 4 phases of the LO signal in the fourth set are 45, 225, 135, 315 degrees, and the 4 phases of the LO signal in the fifth set are 90, 270, 180, 0 degrees.

41. A communication device comprising:
means for generating M phases of a baseband signal to be transmitted to N upconverters;
means for upconverting comprising the N upconverters, wherein the means for upconverting is for receiving a different one of N sets of phases of a local oscillator (LO) signal at each of the N upconverters, each of the N sets comprising M different phases of the LO signal;

means for generating N amplified signals based on signals output from respective one of the N upconverters, wherein the means for generating N amplified signals includes N associated amplifiers, and wherein a gain of at least a first one of the N amplifiers is selected to be different from a gain of remaining one of the N amplifiers; and means for combining the N amplified signals to generate an output signal, wherein a frequency component falling at a multiple of a sum of a LO signal frequency and a baseband signal frequency, or a multiple of a difference between the LO signal frequency and the baseband signal frequency is substantially suppressed from the output signal, and wherein N and M are integers greater than 1.

42. The communication device of claim 41, wherein the means for generating M phases of the baseband signal is further for filtering a baseband in-phase signal to generate a first filtered in-phase signal to be transmitted to the N upconverters; and filtering a baseband quadrature-phase signal to generate a second filtered quadrature-phase signal to be transmitted to the N upconverters.

43. The communication device of claim 42 wherein said baseband in-phase signal comprises a first pair of complementary signals and wherein said baseband quadrature-phase signal comprises a second pair of complementary signals.

44. The communication device of claim 41 wherein N is 3 and M is 4.

45. The communication device of claim 44 wherein to eliminate a third harmonic, first and second amplifiers are selected to have equal gains and a third amplifier is selected to have a gain larger than the gain of the first and second amplifiers.

46. The communication device of claim 45 wherein the gain of third amplifier is selected to be substantially $2^{1/6}$ times the gain of the first and second amplifiers.

47. The communication device of claim 45 wherein the gain of third amplifier is selected to be substantially $2^{1/10}$ times the gain of the first and second amplifiers.

48. The communication device of claim 45 wherein the 4 phases of the LO signal in a first set lead corresponding 4 phases of the LO signal in a second set by 45°.

49. The communication device of claim 48 wherein the 4 phases of the LO signal in a third set lag corresponding 4 phases of the LO signal in the second set by 45°.

50. The communication device of claim 49 wherein the 4 phases of the LO signal in the first set are 315, 135, 45, 225 degrees, the 4 phases of the LO signal in the second set are 0, 180, 90, 270 degrees, and the 4 phases of the LO signal in the third set are 45, 225, 135, 315 degrees.

51. A communication device comprising:

means for generating M phases of a baseband signal to be transmitted to N sets of upconverters, each set comprising Q upconverters, wherein the M phases of the baseband signal are applied to each of the Q upconverters of each of the N sets;

means for upconverting comprising the N sets of upconverters, wherein the means for upconverting is for receiving one of N×Q sets of phases of a local oscillator (LO) signal, each of the N×Q sets comprising M phases of the LO signal, each of the Q upconverters of the N sets of upconverters generating an upconverted in-phase signal and an upconverted inverse signal;

means for combining the Q in-phase signals generated by the Q converters of each of the N sets thereby to generate N combined in-phase signals; and means for combining the Q inverse signals generated by the Q converters of each of the N sets thereby to generate N combined inverse signals, wherein a frequency component falling at a multiple of a sum of a LO signal frequency and a baseband signal frequency, or a multiple of a difference between the LO signal frequency and the baseband signal frequency is substantially suppressed from the combined in-phase and inverse signals, wherein Q, M and N are positive integers greater than 1.

52. The communication device of claim 51, wherein the means for generating M phases of the baseband signal is further for:

filtering a baseband in-phase signal to generate a first filtered in-phase signal to be transmitted to the N sets of upconverters; and filtering a baseband quadrature-phase signal to generate a second filtered quadrature-phase signal to be transmitted to the N sets of upconverters.

53. The communication device of claim 52 wherein said baseband in-phase signal comprises a first pair of complementary signals and wherein said baseband quadrature-phase signal comprises a second pair of complementary signals.

54. The communication device of claim 53 wherein each of N and Q are equal to three.

55. The communication device of claim 54 wherein N×Q sets of phases of the LO signal comprise 5 distinct sets, and M is equal to 4.

56. The communication device of claim 51 further comprising: means for amplifying each of the N combined in-phase signals and each of the N combined inverse signals.

57. The communication device of claim 56 wherein at least one of the amplifications is substantially $2^{1/6}$ times the remaining amplifications.

58. The communication device of claim 56 wherein at least one of the amplifications is substantially $2^{1/10}$ times the remaining amplifications.

59. The communication device of claim 55 wherein the 4 phases of the LO signal received by a first upconverter in each of the N sets lead corresponding 4 phases of the LO signal received by a second upconverter in the set by 45°, and the 4 phases of the LO signal received by a third upconverter in each of the N sets lag the corresponding 4 phases of the LO signal received by the second upconverter in the set by 45°.

60. The communication device of claim 59 wherein the 4 phases of the LO signal in the first set are 270, 90, 0, 180 degrees, the 4 phases of the LO signal in the second set are 315, 135, 45, 225 degrees, the 4 phases of the LO signal in the third are 0, 180, 90, 270 degrees, the 4 phases of the LO signal in the fourth set are 45, 225, 135, 315 degrees, and the 4 phases of the LO signal in the fifth set are 90, 270, 180, 0 degrees.

* * * * *